United States Patent
Togami

[11] Patent Number: 6,037,815
[45] Date of Patent: *Mar. 14, 2000

[54] PULSE GENERATING CIRCUIT HAVING ADDRESS TRANSITION DETECTING CIRCUIT

[75] Inventor: Tetsuji Togami, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/859,102

[22] Filed: May 20, 1997

[30] Foreign Application Priority Data

May 24, 1996 [JP] Japan .................................. 8-153093

[51] Int. Cl.⁷ .................................................. H03K 3/017
[52] U.S. Cl. ........................... 327/172; 327/176; 327/291; 327/293; 327/294
[58] Field of Search ................................... 327/172, 176, 327/165, 166, 291, 293, 294, 299

[56] References Cited

U.S. PATENT DOCUMENTS

| | | | |
|---|---|---|---|
| 4,633,102 | 12/1986 | Childers | 327/78 |
| 4,717,835 | 1/1988 | Takeuchi | 307/265 |
| 4,730,131 | 3/1988 | Sauer | 326/24 |
| 4,788,454 | 11/1988 | Tanagawa et al. | 307/296 R |
| 5,072,131 | 12/1991 | Nakano | 307/231 |
| 5,103,114 | 4/1992 | Fitch | 307/271 |
| 5,313,422 | 5/1994 | Houston | 365/194 |
| 5,343,090 | 8/1994 | Proebsting | 326/21 |
| 5,386,152 | 1/1995 | Naraki | 327/143 |
| 5,438,550 | 8/1995 | Kim | 365/233.5 |
| 5,465,062 | 11/1995 | Fong | 327/172 |

FOREIGN PATENT DOCUMENTS

| | | |
|---|---|---|
| 0 624 878 | 11/1994 | European Pat. Off. . |
| 59-54093 | 3/1984 | Japan . |
| 63-311819 | 12/1988 | Japan . |
| 3-263688 | 11/1991 | Japan . |
| 4-181593 | 6/1992 | Japan . |
| 5-54660 | 3/1993 | Japan . |
| 7-130174 | 5/1995 | Japan . |

*Primary Examiner*—Kenneth B. Wells
*Assistant Examiner*—An T. Luu
*Attorney, Agent, or Firm*—Young & Thompson

[57] ABSTRACT

A pulse generating circuit which has a first and a second delay circuit selectively operable as a delay circuit or a resetting circuit. The delay circuits each has a discharge transistor and a charge transistor in order to fix the potential on its associated node rapidly when operating as a resetting circuit. Even when short pulses are continuously input as an input signal by accident, the circuitry surely outputs a single pulse transitioning at the same time as the first change in the input signal and having a desired duration since the last change in the input signal.

7 Claims, 7 Drawing Sheets

PULSE GENERATING CIRCUIT HAVING ADDRESS TRANSITION DETECTING CIRCUIT

BACKGROUND OF THE INVENTION

1. Field of the Invention

The present invention relates to a pulse generating circuit and, more particularly, to an improvement of a circuit that generates a pulse signal in response to a change in level of an input signal.

2. Description of the Prior art

Such a circuit is widely employed in, for example, a semiconductor memory circuit as an address transition detecting circuit. The circuit generates a pulse by detecting the switching of an address signal or an input signal. The pulse is used to reset an internal memory circuit by discharging a word line, precharging and equalize bit line pairs, and so on. Such a circuit is disclosed in, e.g., Japanese Patent Laid-Open Publication No. 5-54660.

Referring now to FIG. 1, the circuit cited delay circuits D51 and D52, normal inverter gates G55, G56, G57 and G511, NOR gates G58 and G59, and an active-low AND gate G510.

The delay circuit 51 is made up of two inverter gates G51 and G52 and capacitors C51 and C52. The inverter gate G51 has a P-channel transistor P51 having a narrow gate channel width, and an N-channel transistor N51 having a broad gate channel width. The inverter gate G52 has a P-channel transistor P52 having a broad gate channel width, and an N-channel transistor N52 having a narrow gate channel width. The other delay circuit D52 is identical in configuration with the delay circuit D51 and will not be described specifically in order to avoid redundancy. The circuit receives an input signal 501 and produces an output signal 502.

The input signal 502 is fed to the input of the inverter gate G51 whose output is connected to the input of the inverter gate G52. The output of the inverter gate G52 is connected to the input of the inverter gate G56 whose output is connected to one input of the NOR gate G58. The input signal 501 is connected to the other input of the NOR gate G58 also. The capacitor C51 is connected at one end to a power source potential and at the other end to a node 503, i.e., the junction between the inverter gates G51 and G52. The capacitor C52 is connected at one end to ground potential and at the other end to a node 504, i.e., the junction between the inverter gates G52 and G56.

Further, the input signal 501 is applied to the input of the normal inverter gate G55 whose output is connected to the input of the delay circuit D52. The output of the delay circuit D52 is connected to the input of the normal inverter gate G57 whose output is connected to one input of the NOR gate G59. The input of the delay circuit D52 is connected to the other input of the NOR gate 59. The output of the NOR gate G58 and that of the NOR gate G59 are respectively connected to the two inputs of the active-low AND gate G510. The output of the AND gate G510 is connected to the normal inverter gate G511.

Referring now to FIG. 2, there is shown the waveforms of signals to appear at the various nodes of the circuit shown in FIG. 1. There are shown in FIG. 6, the input signal 501, the output signal 502, a signal 503 output from the inverter gate G51, a signal 504 output from the inverter gate G52, a signal 505 output from the normal inverter gate G55, a signal 506 output from the inverter gate G53, a signal 507 output from the inverter gate G54, a signal 508 output from the normal inverter gate G57, a signal 509 output from the NOR gate G59, a signal 510 output from the normal inverter gate G56, a signal 511 output from the NOR gate G58, and a signal 512 output from the AND gate 510.

A specific operation of the above circuit will be described with reference to FIGS. 1 and 2. Assume that the input signal 501 changes from its low level to its high level. Then, the node 503 of the delay circuit D51 goes low immediately due to the inverter gate G51 whose N-channel transistor N51 has a high ability (current drive ability). The node 504 goes high immediately due to the inverter G52 whose P-channel transistor P52 has a high ability. The node 510 connected to the inverter G52 via the normal inverter gate G56 goes low while the node 511, i.e., the output of the NOR gate G58 remains in its low level.

On the other hand, the node 505, i.e., the output of the normal inverter G55 goes low at the rising edge of the input signal 501. The node 506 of the delay circuit D52 goes high slowly due to the inverter gate G53 whose P-channel transistor P53 has a low ability, and a load ascribable to the capacitor C53. The node 507 goes low slowly due to the inverter gate G54 whose N-channel transistor N54 has a low ability, and a load ascribable to the capacitor C54. The node 508, i.e., the output of the normal inverter gate G57 goes high. The node 509, i.e., the output of the NOR gate G59 goes high at the rising edge of the input signal 501, and then goes low with a delay of D provided by the delay circuit D52.

The active-low AND gate G510 ANDs the waveforms appearing on the nodes 509 and 511, and then the inverter G511 inverts the output of the AND gate 510. As a result, the inverter G511 produces the output signal 502 in the form of a pulse having a width D at the rising edge of the input signal 501.

When the input signal 501 goes low, the delay circuits D51 and D52 performs a procedure opposite to the above procedure. Consequently the circuit outputs a pulse having the width D as the output signal 502 at the falling edge of the input signal 501.

As stated above, the conventional circuit of FIG. 1 is capable of outputting a pulse of desired width D at each of the rising and falling edges of the input signal 501. However, assume that two or more short pulses are consecutively applied to the circuit as the input signal 501 by accident, as shown in FIG. 3 specifically. Then, the circuit produces a wrong pulse different from the expected pulse (,or the pulse having a width D) for the following reasons.

As shown in FIG. 3, the node 503 of the delay circuit D51 goes high at the falling edge of the first pulse of the input signal 501. Subsequently, the node 503 goes low at the rising of the second pulse of the input signal 501. At this instant, the level of the node 504 is lowered by the inverter G52. If the lowered level of the node 504 is lower than the threshold voltage of the P-channel transistor of the normal inverter gate G56, then a notch appears, as represented by the waveform of the node 510. As a result, the output of the NOR gate G58 has its width reduced by the notch. This is also true with the other delay circuit D52.

In short, the conventional circuit relies on the inverter in charging and discharging the node of the individual delay circuit. Therefore, if the pulse width of the input signal is smaller than the delay completing time of the delay circuit, and if the reset start signal (the falling edge of the input signal 501) is later in timing than the charging and discharging operation of the inverter, then the above notch appears and prevents the expected waveform from being output. An increase in the number of stages of the delay circuits D51 and D52 would aggravate this problem because it would delay the reset start signal more.

It is a common practice with a semiconductor memory device to match the promotion of the discharge of a word line, short-circuiting of a bit line pair, charge up, activation of data sense amplifier and so forth to the pulse width D of the output signal 502. Therefore, the pulse smaller in width than the expected pulse makes it impossible to keep a period of time necessary for the above operation of the memory device. Consequently, erroneous information is transferred to the memory device and prevents it from operating correctly.

SUMMARY OF THE INVENTION

It is, therefore, an object of the present invention to provide a further improved pulse generating circuit.

It is another object of the present invention to provide a pulse generating circuit for being incorporate in a semiconductor memory device.

It is still another object of the present invention to provide a pulse generating circuit capable of generating, without regard to the condition of an input signal, an output signal having a predetermined width and free from a notch.

A pulse generating circuit according to the present invention is featured by employing a charge or discharge circuit except an inverter circuit for the pulse generating circuit. The pulse generating circuit is made up of a delay circuit receiving an input signal, a discharge circuit being connected with an output of the delay circuit, an inverter gate shaping the output of the delay circuit, a charge circuit being connected with an output of the inverter gate, and a NAND gate receiving the input signal and the output of the inverter gate. The charge or discharge circuit receives an input signal, and controls an electrical potential of a node of the pulse generating circuit speedy.

Accordingly, even when short pulses are consecutively applied as an input signal to the pulse generating circuit, a notch-shaped signal is not appear on the node of the circuit. Therefore, the present invention can prevent an output pulse having a short width shorter than a predeterminded width.

BRIEF DESCRIPTION OF THE DRAWINGS

The above and other objects, features and advantages of the present invention will be more apparent from the following detailed description taken in conjunction will the accompanying drawings, in which.

DETAILED DESCRIPTION OF THE PREFERRED EMBODIMENT

Figure 1:
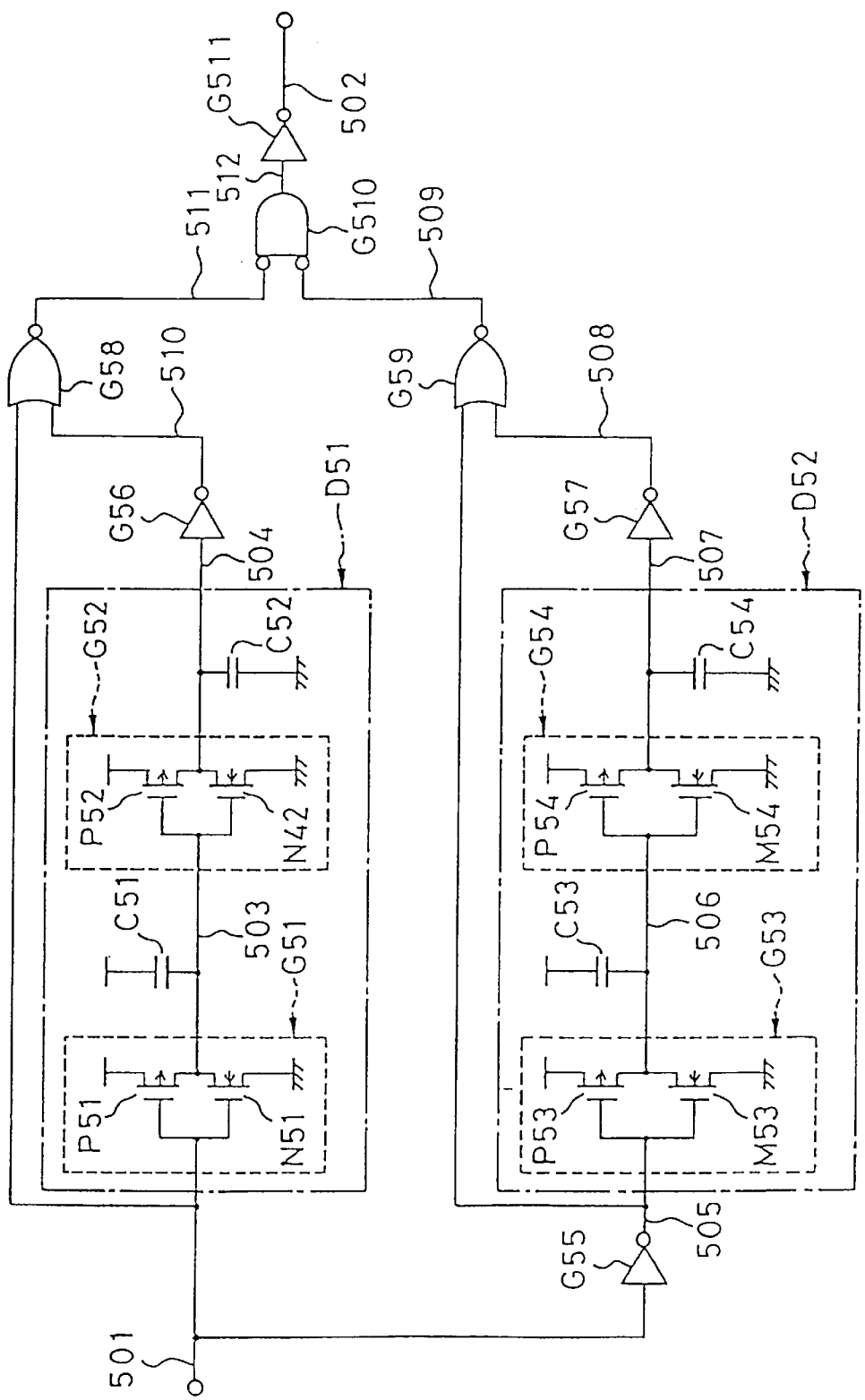
FIG. 1 is a schematic block diagram showing conventional pulse generating circuit.
Figure 2:
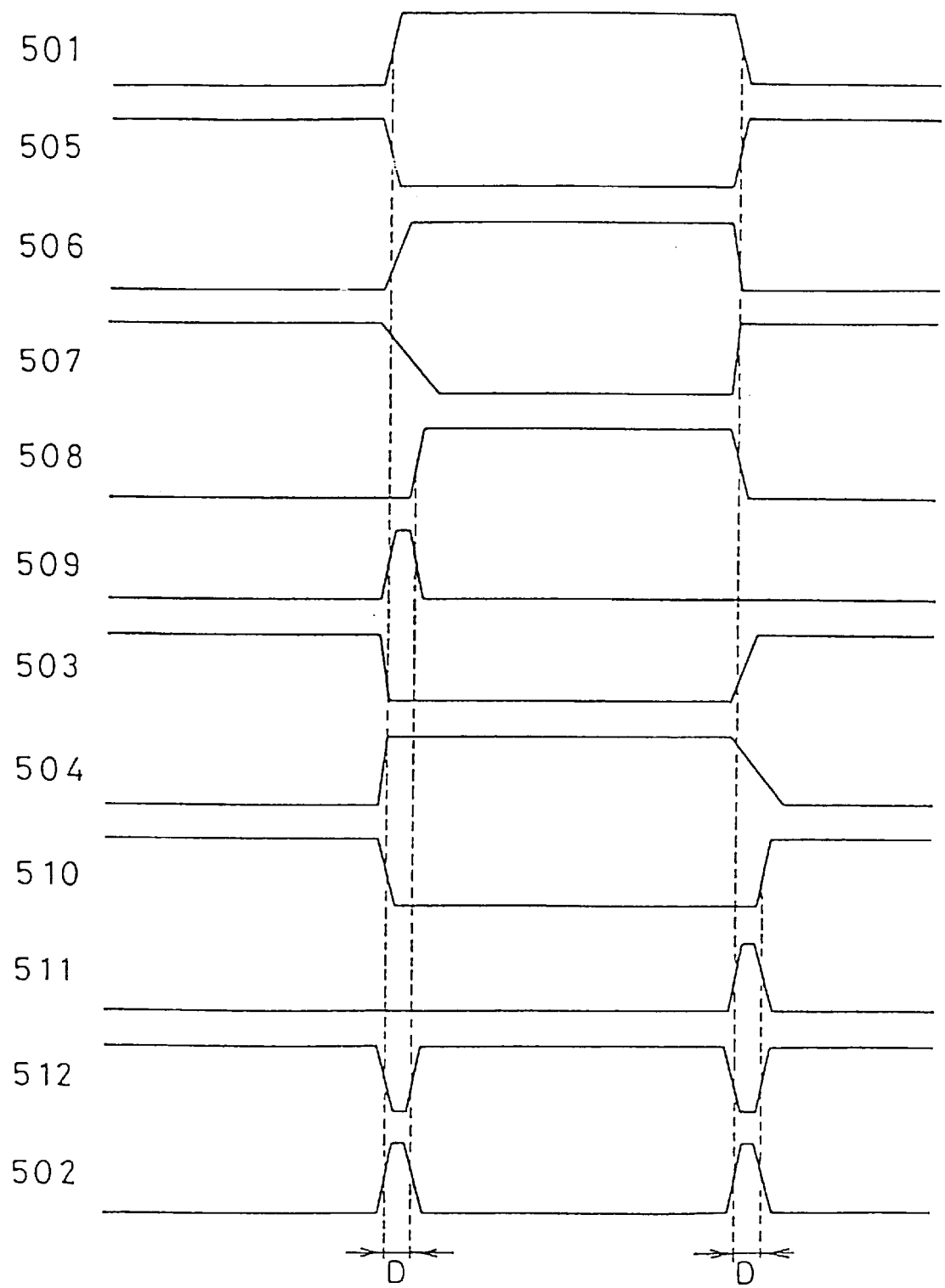
FIG. 2 is a timing chart showing the waveforms of signals to appear on various nodes included in the conventional circuit.
Figure 3:
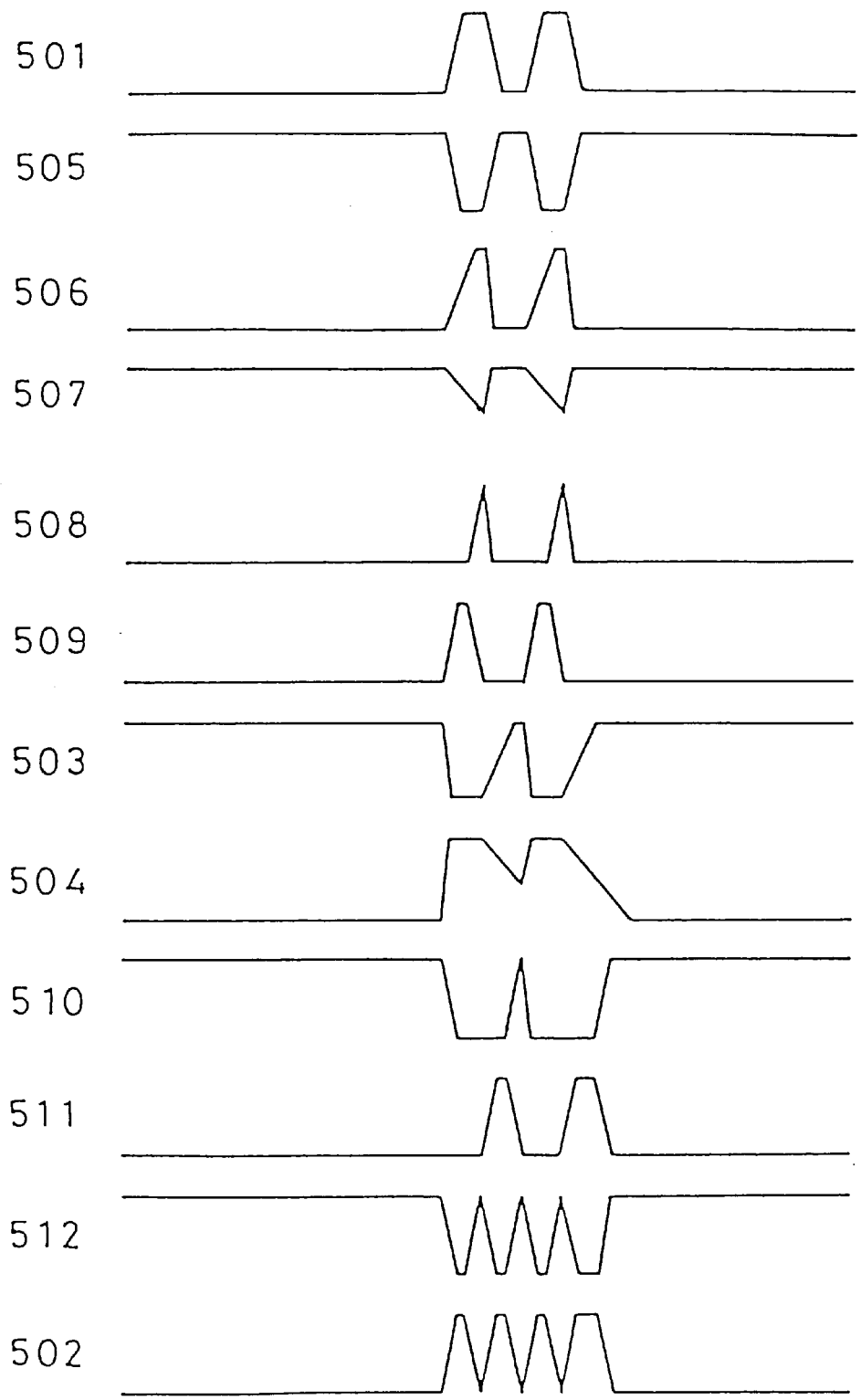
FIG. 3 is a timing chart similar to FIG. 1, but showing a different condition.
Figure 4:
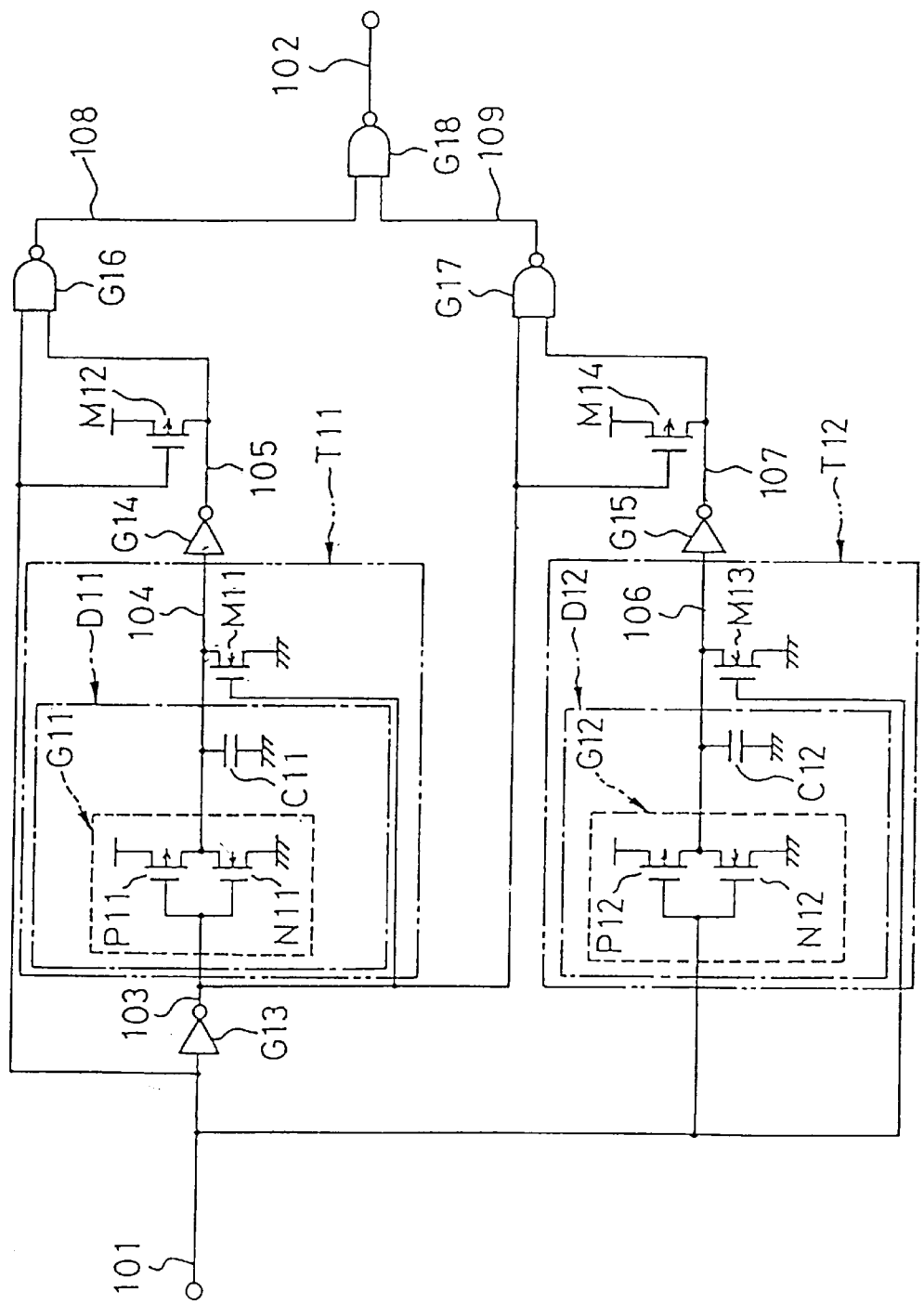
FIG. 4 is a block diagram schematically showing pulse generating circuit embodying the present invention.

Referring now to FIG. 4, there is shown a pulse generating circuit 100 in accordance with an embodiment of the present invention, that is shown and implemented as address transition detector by way of example. An unit of pulse generating circuit is comprised by a delay circuit, a discharge circuit, a charge circuit, a normal inverter gate, and a NAND gate. In this case, As shown, the circuit 100 is generally made up of an upper circuit group, as viewed in FIG. 4, for producing a delay in response to the rising edge of an input signal 101, and a lower circuit group for producing a delay in response to the falling edge of the input signal 101. Namely, the upper circuit group generates a pulse signal in response to the rising edge of an input signal 101, and the lower circuit group generates a pulse signal in response to the falling edge of an input signal 101.

The upper circuit group includes a normal inverter gates G13 and G14, a first delay circuit D11, a discharge circuit M11, a charge circuit M12, and a NAND gate G16. The first delay circuit or integrating circuit D11 made up of an inverter gate G11 and a capacitor C11. The inverter gate G11 has a P-channel transistor P11 having a narrow gate channel width, and an N-channel transistor N11 having a broad gate channel width. A normal inverter gate G14 is used to shape a waveform. A discharge transistor M11 discharges a node 104 in a moment so as to bring it to a low level. A charge transistor M12 charges a node 105 in a moment so as to bring it to a high level. A NAND gate G16 generates a pulse having a width of D in response to the input signal 101 and the output of the normal inverter gate G14.

In the prefered embodiment, the normal inverter gate G13 has one P-channel transistor and one N-channel transistor. A gate channel width (W) of P-channel transistor of G13 is set to 12 $\mu$m, and a gate channel length (L) of P-channel transistor of G13 is set to 0.9 $\mu$m. Also, W of N-channel transistor of G13 is set to 6 $\mu$m, and L of N-channel transistor of G13 is set to 0.8 $\mu$m. As a results, the current drive ability of the P-channel transistor of G13 is equal to the N-channel transistor of G13 thereof. In addition, a construction of the normal inverter gate G14 is equal to the normal inverter gate G13. On the other hand, the inverter gate G11 has one P-channel transistor and two N-channel transistors. The N-channel transistors of G11 are connected in series. W of P-channel transistor of G11 is set to 12 $\mu$m, and L of P-channel transistor of G11 is set to 0.9 $\mu$m. Also, W of N-channel transistors of G11 are set to 6 $\mu$m, and L of N-channel transistors of G11 are set to 2.0 $\mu$m, respectively. Therefore, the current drive ability of the N-channel transistor of G11 larger than the P-channel transistor of G11 thereof. Furthermore, a size of the discharge transistor corresponds to the N-channel transistor of the normal inverter gate G13. A size of the charge transistor corresponds to the P-channel transistor of the normal inverter gate G13.

The lower circuit group includes a normal inverter gate G15, a second delay circuit D12, a discharge circuit M13, a charge circuit M14, and a NAND gate G17. The second delay circuit D12 made up of an inverter gate G12 and a capacitor C12. The inverter gate G12 has a P-channel transistor P12 having a narrow gate channel width, and an N-channel transistor N12 having a broad gate channel width. A normal inverter gate G15 shapes a waveform. A discharge transistor M13 discharges a node 106 in a moment so as to bring it to a low level. A charge transistor M14 charges a node 107 in a moment so as to bring it to a high level. A NAND gate G17 generates a pulse having the width D in response to the output of the normal inverter gate G13 and that of the normal inverter gate G15.

The output pulse of the upper circuit group and the output pulse of the lower circuit group are applied to and NANDed by a NAND gate G18. The reference numeral 101 designates an input signal, and the reference numeral 102 designates an output signal.

Specifically, the input signal 101 is applied to the input of the inverter gate G11 and the gate of the discharge transistor M11 via the normal inverter gate G13. The output of the inverter gate G11 is connected to the drain of the discharge transistor M11 and the input of the normal inverter gate G14. The output of the normal inverter gate G14 is connected to the drain of the charge transistor M12 and one input of the NAND gate G16. The input signal 101 and the gate of the charge transistor M12 are connected to the other input of the NAND gate G16. The capacitor C11 is connected at one end to ground potential and at the other end to the node 104, i.e., the junction between the inverters G11 and G14.

Further, the input signal 101 is connected to the input of the inverter gate G12 and the gate of the discharge transistor M13. The output of the inverter gate G12 is connected to the drain of the discharge transistor M13 and the input of the inverter gate G15. The output of the inverter gate G15 is connected to the drain of the charge transistor M14 and one input of the NAND gate G17. Connected to the other input of the NAND gate G17 are the output 103 of the normal inverter gate G13 and the gate of the charge transistor M14. The capacitor C12 is connected at one end to ground potential and at the other end to the node 106, i.e., the junction between the inverter gates G12 and G15.

The outputs of the NAND gates G16 and G17 are connected to the input of the NAND gate G18 which produces the output signal 102.

The first delay circuit D11 plays the role of a delay circuit via the inverter gate G13 at the falling edge of the input signal 101 or plays the role of a high-speed inverter at the rising edge of the signal 101. The second delay circuit 12 is identical in configuration with the first delay circuit D11. The delay circuit 12 plays the role of a delay circuit at the rising edge of the signal 101 or plays the role of a high-speed inverter at the falling edge of the signal 101.

The inverter gates G14 and G15 each shapes the signal waveform input thereto and unsharpened due to the associated delay circuit D11 or D12.

The discharge transistor M11 assigned to the first delay circuit D11 is implemented as an N-channel MOS (Metal Oxide Semiconductor) transistor. The input signal 101 is inverted by the normal inverter gate G13 and then applied to the gate of the N-channel MOS transistor M11. The transistor M11 turns on at the falling edge of the input signal 101, causing the node 104 to go low speedy. Likewise, the discharge transistor M13 assigned to the second delay circuit D12 is implemented as an N-channel MOS transistor which receives the input signal 101 at its gate. The transistor M13 turns on at the rising edge of the input signal 101, causing the node 106 go low speedy.

The charge transistor M12 is a P-channel MOS transistor receiving the input signal 101 at its gate. The transistor M12 turns on at the falling edge of the input signal 101, the node 105 at its high level speedy. The charge transistor M14 is a P-channel MOS transistor receiving at its gate a signal which the normal inverter gate G13 outputs by inverting the input signal 101. The transistor M14 turns on at the rising edge of the input signal 101, the node 107 at its high level speedy.

Figure 5:
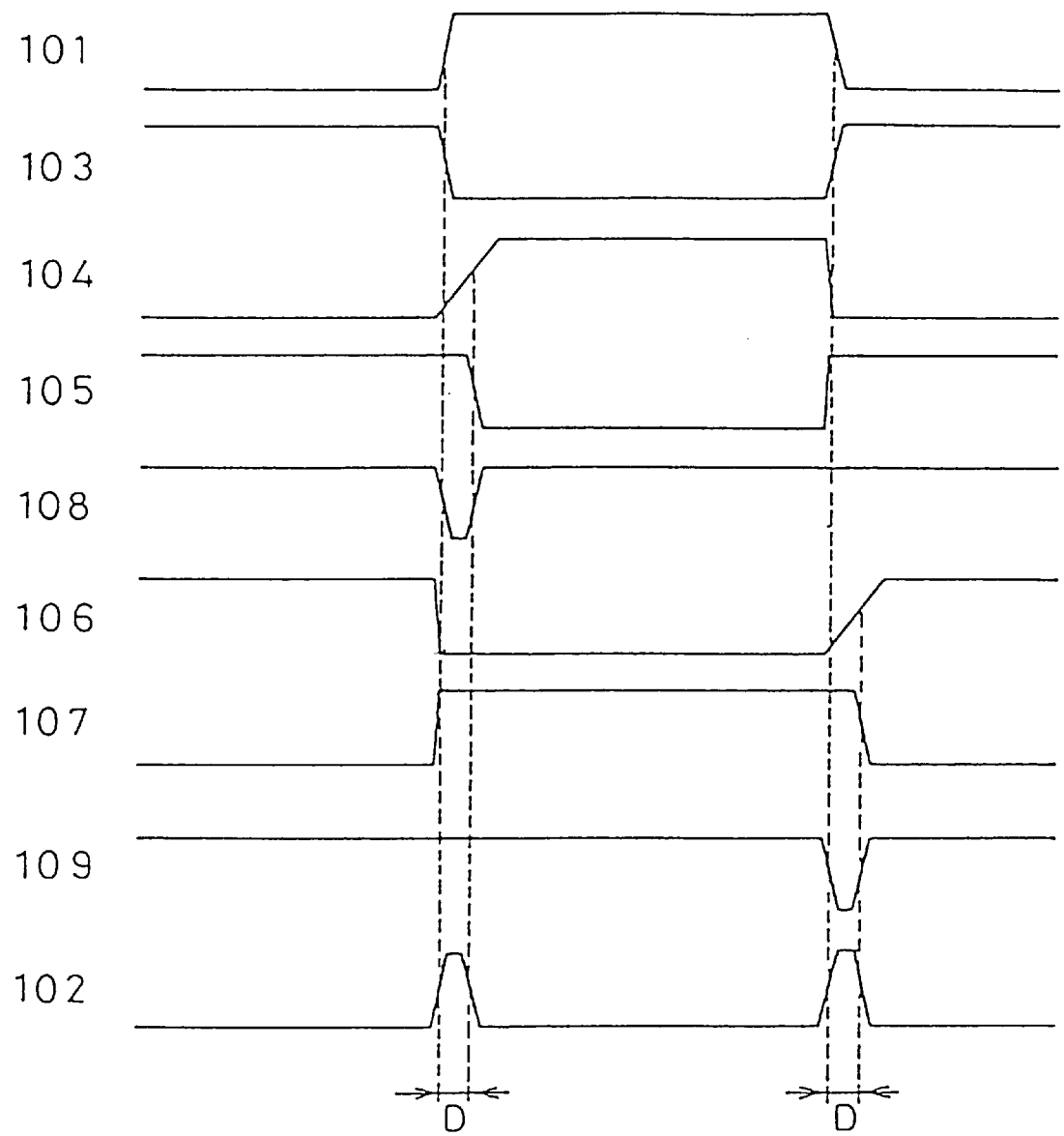
FIG. 5 is a timing chart showing the waveforms of signals to appear on various nodes included in the embodiment.

Referring now to FIG. 5, there is shown the waveforms of signals to appear at the various nodes of the circuit shown in FIG. 4. There are shown in FIG. 5, the input signal 101, the output signal 102, a signal 103 output from the normal inverter gate G13, a signal 104 output from the inverter gate G11, a signal 105 output from the normal inverter gate G14, a signal 106 output from the inverter gate G12, a signal 107 output from the normal inverter gate G15, a signal 108 output from the NAND gate G16, and a signal 109 output from the NAND gate G17.

As shown in FIG. 5, assume that the input signal 101 goes high (first level) from its low level (second level). Then, the node 103 changes from its high level to its low level due to the normal inverter gate G13. The first delay circuit D11 serves as an integrating circuit in response to the change of the node 103 from the high level to the low level. As a result, the waveform on the node 104 turns out an integrated waveform rising slowly from the low level to the high level.

The node 105 goes low that behind the rising edge of the input signal because of the inverter gate G14.

The NAND gate G16 generates a pulse on the basis of the input signal 101 and the signal on the node 105. The output of the NAND gate G16, i.e., the node 108 goes low at the rising edge of the input signal 101, and then goes high with the delay D provided by the first delay circuit D11.

On the change of the input signal 101 from the low level to the high level, the node 106 goes low speedy because the discharge transistor M13 turns on in a moment. The node 107 goes high speedy because the charge transistor M14 turns on in response to the change of the node 103 from the high level to the low level.

The NAND gate G17 is used to generate a pulse on the basis of the levels of the nodes 107 and 103. At this instant, the output of the NAND gate G17, i.e., the node 109 remains in its high level because the nodes 107 and 103 respectively go high and go low substantially at the same time.

The NAND gate G18 produces the output signal 102 on the basis of the levels of the nodes 108 and 109. In this case, the output signal 102 goes high when the node 108 goes low, and then goes low when the node 108 goes high. Consequently, the output signal 102 goes high substantially at the same time as the input signal 101 goes high, and then goes low with the delay D caused by the first delay circuit D11.

The operation of the circuit to occur on the transition of the input signal 101 from the high level to the low level is exactly opposite to the above operation, and will not be described specifically in order to avoid redundancy.

Figure 6:
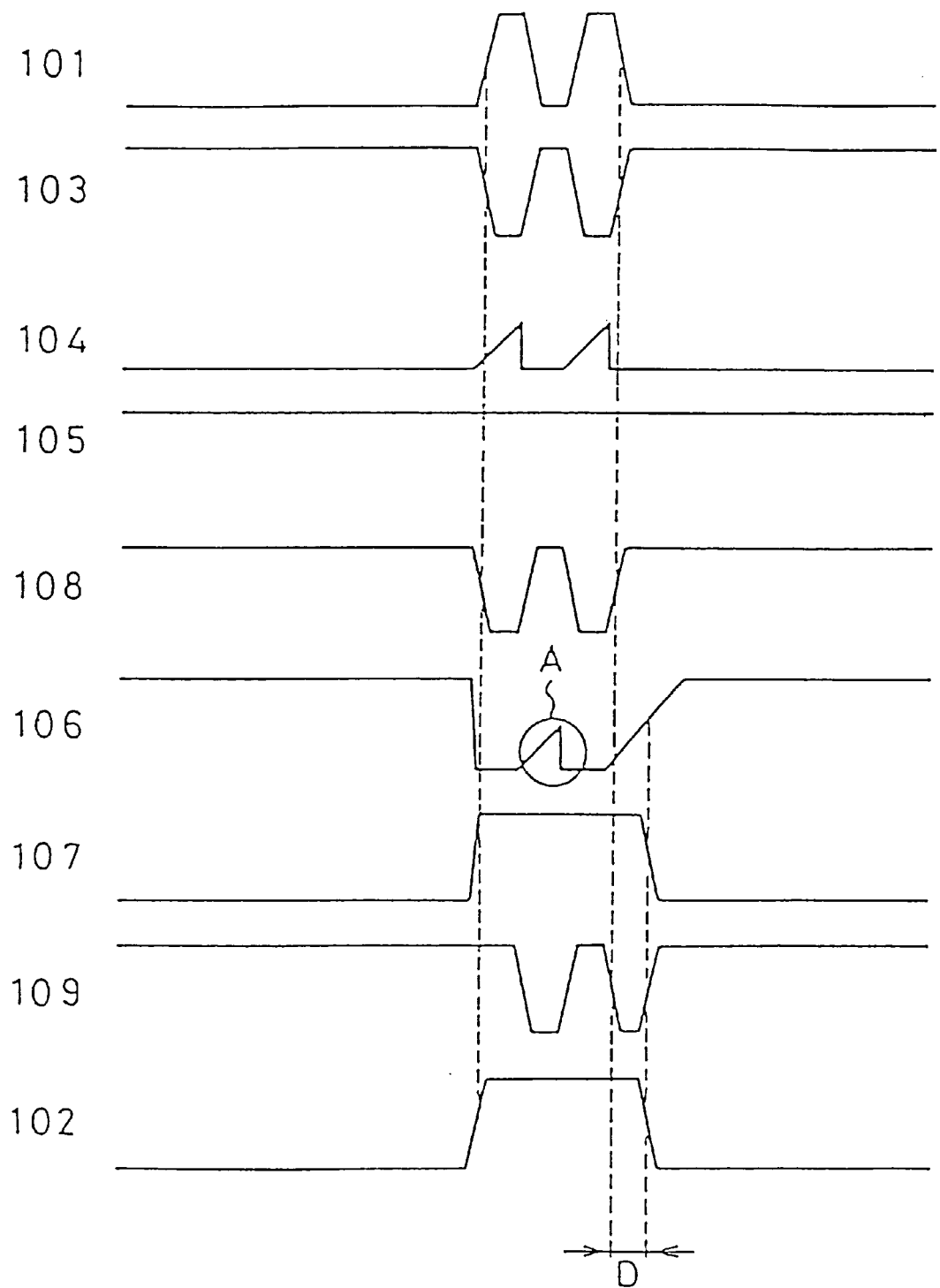
FIG. 6 is a timing chart similar to FIG. 4, but demonstrating a different condition.

Reference will be made to FIG. 6 for describing a specific case wherein the user has accidentally input two or more short pulses continuously.

In this case, at first, the node 104 starts rising slowly from the low level to the high level in response to the high level of the input signal 101. However, on the way to rising of the node 104, the input signal 101 has started falling, the discharge transistor M11 turns on in response to the rise of the node 103, causing the node 104 to go low speedy. As a result, the level of the node 104 does not rise to the threshold voltage of the inverter gate G14 adapted for waveform shaping, causing the node 105 to remain in its high level. Accordingly, the node 108, i.e., the output of the NAND gate G16 goes low at the same time as the input signal 101 goes high, and then goes high at the same time as the input signal 101 goes low.

On the other hand, the discharge transistor M13 turns on when the input signal 101 goes high. Since, the node 106 to go low speedy. After that, the node 106 rises slowly in response to the falling edge of second input pulse.

The charge transistor M14 turns on in response to the fall of the node 103, causing the node 107 go high speedy. However, when the level A of the node 106 (as shown in FIG. 6) is lower than the threshold voltage of the inverter gate G15. Since, the node 107 remains in its high level. While, in response to the node 106 going high slowly, the node 107 goes low via the inverter gate G15.

The waveforms on the nodes 107 and 103 are input to the NAND gate 17. The output of the NAND gate 17, i.e., the node 109 goes low when the node 107 is in the high level and when the node 103 goes high. Then, the node 109 goes high when the node 107 is caused to go low by the inverter gate G15.

The waveforms on the nodes 108 and 109 are input to the NAND gate G18. As shown in FIG. 6, the output 102 of the NAND gate 12 goes high in response to the node 108 goes low, and then goes low in response to the second rising edge of the node 109. In this manner, the output 102 goes high substantially at the same time as the input signal 101 goes high, and then goes low with the delay D since the last fall of the input signal 101 due to the second delay circuit D12. Therefore, even when the short pulses shown in FIG. 6 are input continuously, the circuit 100 can generate a pulse having the width more than D.

Figure 7:
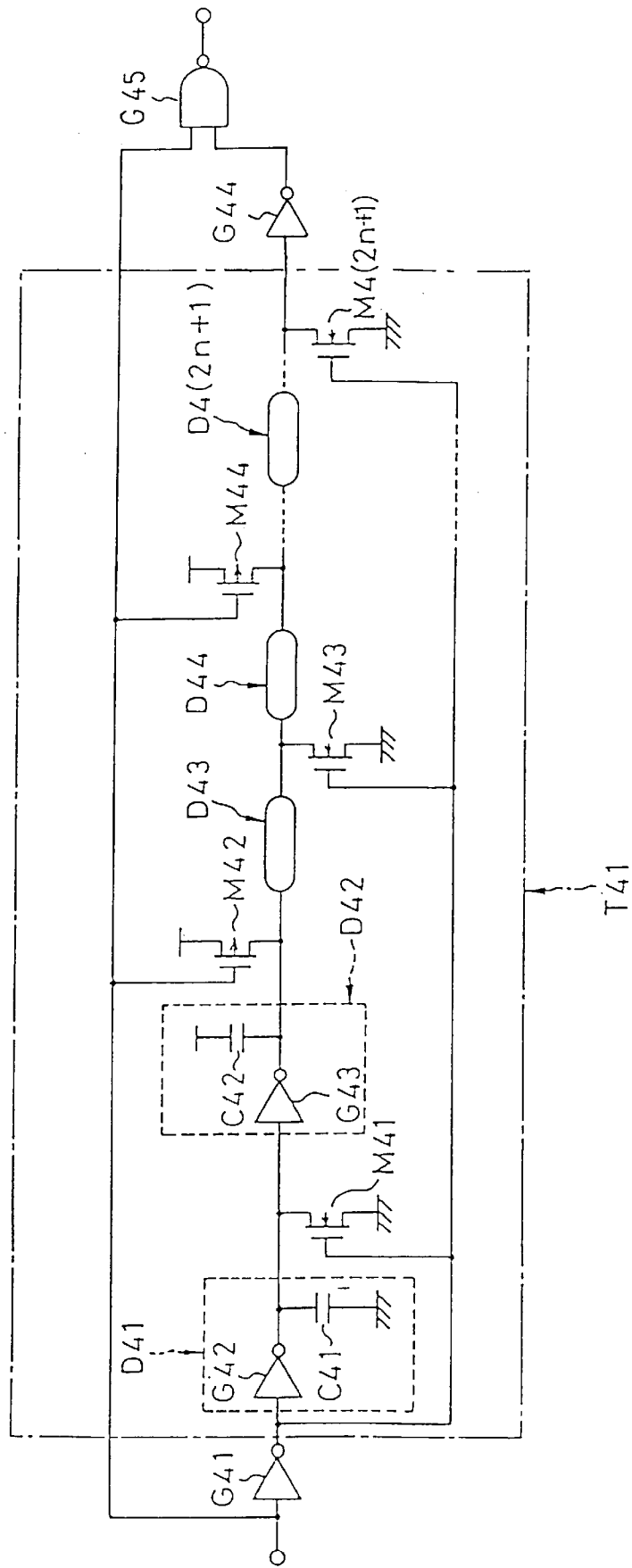
FIG. 7 is a block diagram schematically showing another embodiment of the present invention.

Referring now to FIG. 7, there is shown another embodiment of the present invention will be described which further enhances the advantages of the present invention. As shown, a circuit network T41 is constructed to increase the pulse width D by increasing a circuit network T11 or T12 shown in FIG. 4. The network T41 includes a delay circuit D41 identical with the delay circuit D11 or D12 shown in FIG. 4. A delay circuit D42 has an inverter gate G43 and a capacitor C42. The inverter gate G43 is made up of a P-channel transistor having a high ability and an N-channel transistor having a low ability. The capacitor C42 is con-source potone end to a power source potential and at the other end to the output of the inverter gate G43. Such two different kinds of delay circuits are connected in an odd number of stages. Specifically, delay circuits D43 and D44 are-identical in configuration with the delay circuits D41 and D42, respectively. Further, a delay circuit D4(2n+1) is identical with the delay circuit D41. There are also shown in FIG. 4, an inverter gate G41, discharge transistors M41, M43 and M4(2n+1), and charge transistors M42 and M44.

In this case, more preferably, the inverter gate G43 has two P-channel transistors and one N-channel transistor. The P-channel transistors of G43 are connected in series. A gate channel width (W) of P-channel transistors of G43 are set to 12 μm, and a gate channel length (L) of P-channel transistors of G43 are set to 2.0 μm, respectively. Also, W of N-channel transistor of G43 is set to 6 μm, and L of N-channel transistor of G11 is set to 0.8 μm. Therefore, the current drive ability of the P-channel transistor of G43 larger than the N-channel transistor of G43 thereof.

In the past, when the number of delay circuits is increased in order to broaden the pulse width D, as stated above, a certain period of time is necessary for the potential at each node to be fixed when the delay circuit associated with the node operates as a resetting circuit. However, in the illustrative embodiment, the discharge transistor or the charge transistor located on each node allows the node potential to be fixed in a moment when the associated delay circuit operates as a resetting circuit. Therefore, even when short pulses are input continuously, the circuit surely outputs a pulse having the width more than D, and does not output a short pulse.

In summary, it will be seen that the present invention provides pulse generating circuit capable of surely outputting a single pulse which transitions at the same time as the first transition of an input signal and has a desired duration since the last transition of the input signal. This advantage becomes more noticeable as the number of delay circuit stages is increased.

Such an unprecedented advantage is derived from discharge circuits and charge circuits capable of determining the potentials of associated nodes in a moment.

It is apparent that the present invention is not limited to the illustrated embodiment, but may be modified we changed without departing from the scope and spirit of the invention.

What is claimed is:

1. A pulse generating circuit comprising:

a delay circuit supplied with an input signal and outputting a first delayed signal on a first delay node, the first delayed signal changing from a first logic level to a second logic level after the input signal changes from the second logic level to the first logic level;

a first inverter having an input connected to said first delay node;

a first logic circuit supplied with an inverted signal of the input signal and an output signal of said first inverter, said first logic circuit outputting a pulse signal when both the inverted signal and the output signal of said first inverter takes the second logic level;

a first transistor of a first channel type having a source-drain path connected between said first delay node and a first voltage line and a gate supplied with the input signal;

a second delay circuit supplied with the inverted signal and outputting a second delayed signal on a second delay node, the second delayed signal changing from the first logic level to the second logic level after the inverted signal changes from the second logic level to the first logic level;

a second inverter whose input is connected to said second delay node;

a second logic circuit supplied with the input signal and an output signal of said second inverter, said second logic circuit outputting a second pulse signal when both of the input signal and the output signal of said second inverter takes the second logic level; and a third transistor of said first channel type having a source-drain path connected between said second delay node and said first voltage line and a gate supplied with the inverted signal.

2. The circuit of claim 1, further comprising a fourth transistor of a second channel type having a source-drain path connected between an output node of said second inverter and a second voltage line and a gate supplied with the input signal.

3. The circuit of claim 1, further comprising a second capacitor coupled between said third delay node and said first voltage line.

4. The circuit of claim 1, wherein said second logic circuit is a NAND circuit.

5. A pulse generating circuit comprising:

a delay circuit supplied with an inverted signal of an input signal and outputting a first delayed signal on a first delay node, the first delayed signal changing from a first logic level to a second logic level after the inverted input signal changes from the second logic level to the first logic level;

a first inverter having an input connected to said first delay node;

a first logic circuit supplied with the input signal and an output signal of said first inverter, said first logic circuit outputting a pulse signal when both of the input signal and the output signal of said first inverter takes the second logic level;

a first transistor of a first channel type having a source-drain path connected between said first delay node and a first voltage line and a gate supplied with the inverted signal of the input signal;

a second transistor of a second channel type having a source-drain oath connected between an output node of said first inverter and a second voltage line and a gate supplied with the input signal;

a second delay circuit supplied with the input signal and outputting a second delayed signal on a second delay node, the second delayed signal changing from the first logic level to the second logic level after the input signal changes from the second logic level to the first logic level;

a second inverter whose input is connected to said second delay node;

a second logic circuit supplied with the inverted signal of the input signal and an output signal of said second inverter, said second logic circuit outputting a second pulse signal when both of the inverted signal and the output signal of said second inverter takes the second logic level;

a third transistor of said first channel type having a source-drain path connected between said second delay node and said first voltage line and a gate supplied with the input signal; and a fourth transistor of a second channel type having a source-drain path connected between an output node of said second inverter and a second voltage line and a gate supplied with the inverted signal of the input signal.

6. The circuit of claim 5, further comprising a second capacitor coupled between said third delay node and said first voltage line.

7. The circuit of claim 5, wherein said second logic circuit is a NAND circuit.

* * * * *